(12) United States Patent
Hebrank et al.

(10) Patent No.: US 9,846,208 B2
(45) Date of Patent: Dec. 19, 2017

(54) METHOD AND APPARATUS FOR ACQUIRING A MAGNETIC RESONANCE IMAGE DATA SET AND MAGNETIC RESONANCE DEVICE

(71) Applicant: Siemens Aktiengesellschaft, Munich (DE)

(72) Inventors: Franz Hebrank, Herzogenaurach (DE); Wilhelm Horger, Schwaig (DE); Michael Koehler, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 446 days.

(21) Appl. No.: 14/607,240

(22) Filed: Jan. 28, 2015

(65) Prior Publication Data
US 2015/0212171 A1    Jul. 30, 2015

(30) Foreign Application Priority Data
Jan. 28, 2014   (DE) .................... 10 2014 201 475

(51) Int. Cl.
*G01V 3/00* (2006.01)
*G01R 33/36* (2006.01)
(Continued)

(52) U.S. Cl.
CPC ......... *G01R 33/3635* (2013.01); *G01R 33/36* (2013.01); *G01R 33/387* (2013.01); *G01R 33/44* (2013.01); *G01R 33/5659* (2013.01); *G01R 33/3607* (2013.01); *G01R 33/5616* (2013.01); *G01R 33/56341* (2013.01)

(58) Field of Classification Search
CPC .............. G01R 33/543; G01R 33/5659; G01R 33/3415; G01R 33/36; A61B 5/055
See application file for complete search history.

(56) References Cited

U.S. PATENT DOCUMENTS 5,212,450 A  *  5/1993  Murphy-Boesch  G01R 33/34046
                                                324/318
5,898,306 A  *  4/1999  Liu ................... G01R 33/3678
                                                324/318

(Continued)

OTHER PUBLICATIONS

Nistler et al., "Homogeneity Improvement Using a 2 Port Birdcage Coil," Proc. Intl. Soc. Mag. Reson. Med., vol. 15 (2007), p. 1063.

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a method and apparatus for acquiring a magnetic resonance image data set of a scan area of an examination subject, the image data are acquired with a magnetic resonance apparatus having a transmitter coil that emits a radio-frequency signal having at least two transmission channels so that different polarizations of the radio-frequency signal are produced, and a magnetic resonance sequence is used to acquire raw data for the magnetic resonance image data set, wherein raw data are acquired during at least two scanning operations with the magnetic resonance sequence, with different polarizations of the radio-frequency signals being used for at least two of the at least two scanning operations, following which the magnetic resonance image data set is determined by averaging the raw data.

20 Claims, 2 Drawing Sheets

(51) Int. Cl.
*G01R 33/387* (2006.01)
*G01R 33/44* (2006.01)
*G01R 33/565* (2006.01)
G01R 33/561 (2006.01)
G01R 33/563 (2006.01)

(56) References Cited

U.S. PATENT DOCUMENTS

| | | | | |
|---|---|---|---|---|
| 6,624,629 | B1 * | 9/2003 | Speier | G01R 33/4608 |
| | | | | 324/303 |
| 6,624,633 | B1 * | 9/2003 | Zou | G01R 33/3415 |
| | | | | 324/318 |
| 2013/0181868 | A1 * | 7/2013 | Le Pezennec | H04B 7/0465 |
| | | | | 342/372 |

* cited by examiner

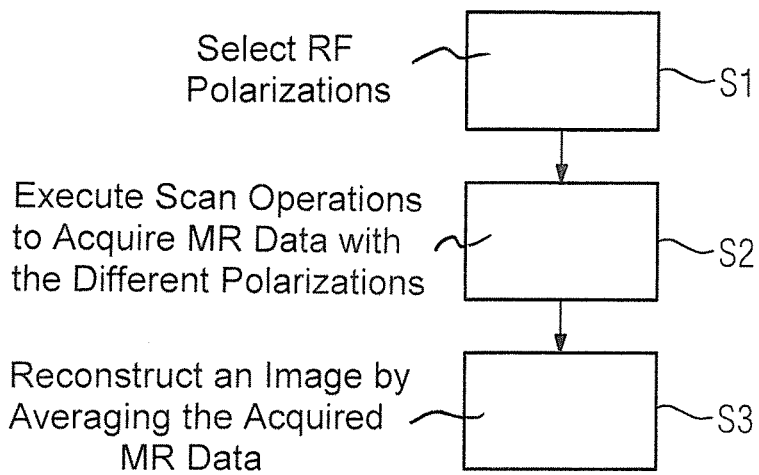
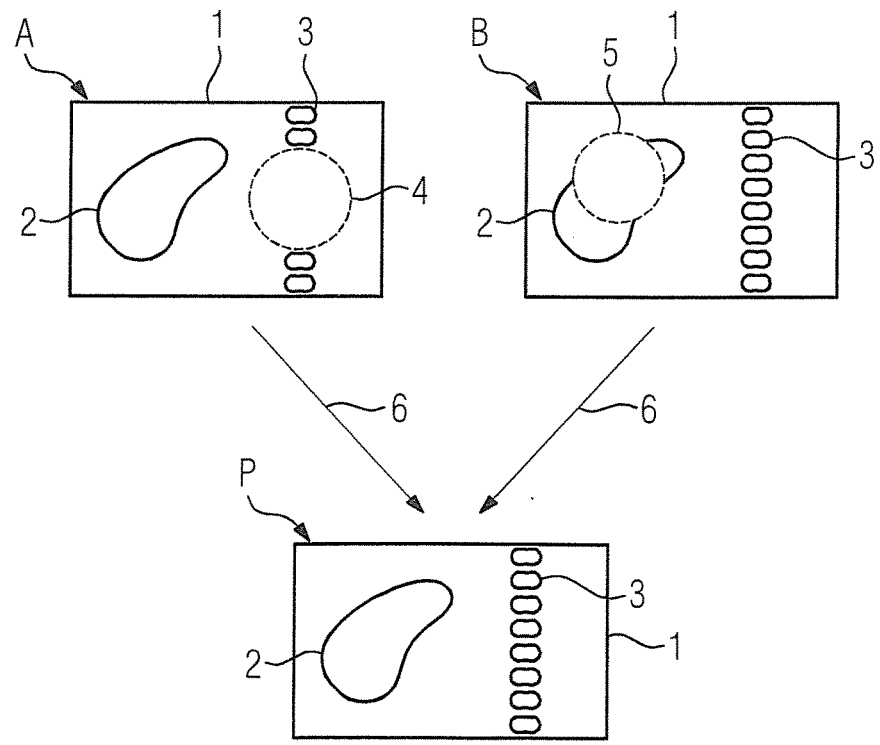

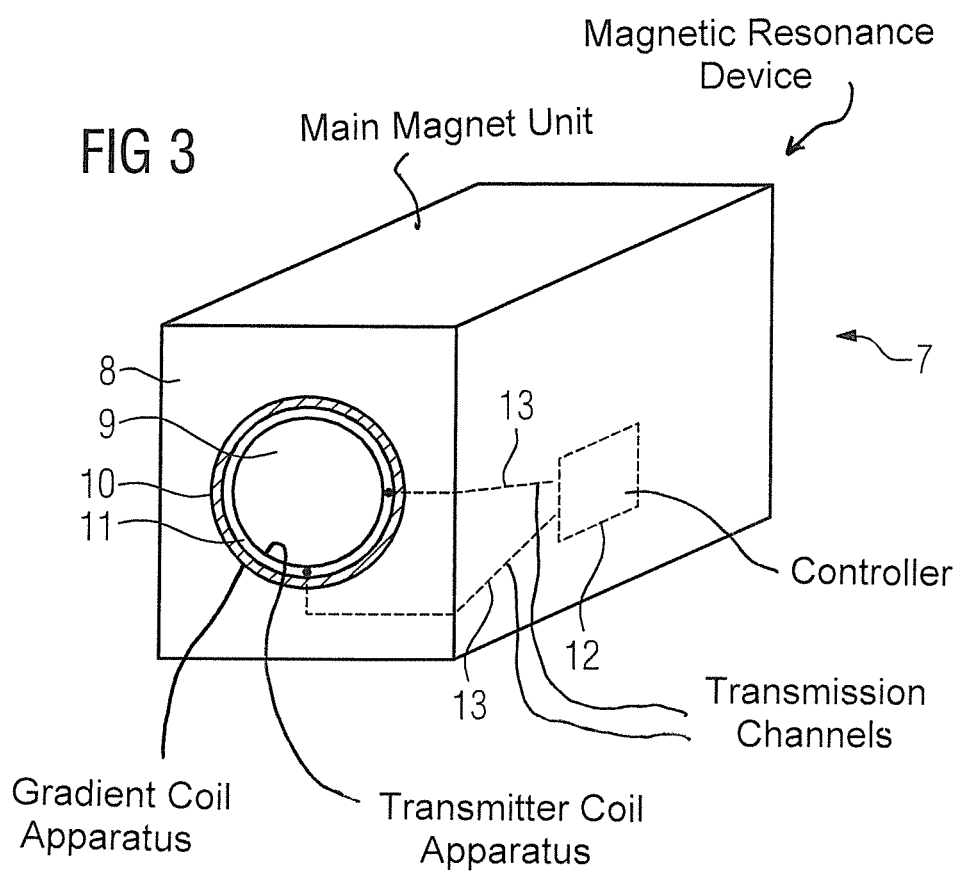

METHOD AND APPARATUS FOR ACQUIRING A MAGNETIC RESONANCE IMAGE DATA SET AND MAGNETIC RESONANCE DEVICE

BACKGROUND OF THE INVENTION

Field of the Invention

The invention relates to a method for acquiring a magnetic resonance image data set of a scan area of an examination subject to be scanned with a magnetic resonance device having a transmitter coil apparatus to emit a radio-frequency signal, in particular with at least two transmission channels, such that different polarizations of the radio-frequency signal can be realized, it being the case that a magnetic resonance sequence is used to capture raw data for the magnetic resonance image data set. The invention additionally relates to a magnetic resonance apparatus designed to implement such a method.

Description of the Prior Art

Magnetic resonance imaging and its principles are widely known. An object to be examined is placed in a static magnetic field with a relatively high field strength. This field is referred to as the B0 field. In order to be able to acquire magnetic resonance data, for example in a slice of the object, the nuclear spins of this slice are excited and the decay of this excitation, for example, is analyzed as a signal. Gradient fields can be generated using a gradient coil apparatus, while a radio-frequency transmitter coil apparatus emits radio-frequency excitation pulses that are often referred to as radio-frequency pulses. The cumulative effect of the radio-frequency pulses ("excitation") generates a radio-frequency field that is usually referred to as the B1 field and flips (deflects) the spins of resonant excited nuclei, selectively located by the gradients, with respect to the magnetic field lines of the static magnetic field, by an amount known as a flip angle. The excited spins of the nuclei then radiate radio-frequency signals that can be received using suitable receiving antennas, in particular including the transmitter coil apparatus itself, which then also acts as a receiver coil apparatus, and processed in such a way that magnetic resonance image data can be reconstructed.

Conventional transmitter coil apparatuses are operated in a manner referred to as a "homogeneous mode", for example in a "CP mode" (circular polarization mode), with a single radio-frequency pulse having specific amplitude characteristics and phase differences being applied to all components of the transmitter coil, for example all transmission rods of a birdcage antenna. It has been proposed, in order to increase flexibility and create new scope to improve imaging, also to enable operation known as parallel transmission (pTX), in which multiple transmission channels of a transmitter coil apparatus each have applied to them separate pulses that can differ from one another. For example, transmitter coil apparatuses having two transmission channels have been proposed with which it is possible to realize an elliptical polarization (EP) of the B1 field as well as a circular polarization (CP) by selecting the phase difference between the channels and/or the amplitude characteristics accordingly. Consequently the polarization of a resulting B1 field can be described for each of the at least two channels by means of the parameters phase and amplitude, for example. Such a multi-channel pulse (excitation), which is composed of separate pulses for the different transmission channels, is often referred to as a "pTX pulse" (for "parallel transmission"). It should be noted that it is not essential when using two transmission channels that these channels be operated independently, because different polarizations can also be realized by a single actuation channel with a single amplifier device. The pulse shape is then the same for both transmission channels=elements of the transmitter coil; the only difference is the phase and/or amplitude. The following is also intended to encompass apparatuses of this type where at least two transmission channels are concerned.

Inhomogeneities of the B1 field specifically also have an effect on the quality of the magnetic resonance image data in the case of measurements with a high magnetic field strength of the static magnetic field, for example with field strengths of greater than or equal to 3 tesla. It is problematic in this connection that the nature of the inhomogeneities varies as a function of the electrical and dielectric properties of the examination subject, in particular a patient, which makes it difficult to realize a generally applicable correction. The flip angle actually achieved thus also exhibits local variation and no longer corresponds to the desired value throughout the scan area. The principal effects of such B1 field inhomogeneities in the magnetic resonance image data set are fluctuations in the image brightness and contrast. Variations in the B1 field strength, irrespective of whether in the positive or negative direction, can in particular lead to a marked localized loss of intensity, even to the extent of complete signal dropout, in some magnetic resonance sequences. This can make it more difficult, even impossible, to assess the magnetic resonance image data in such areas, especially for diagnostic purposes.

Solutions to resolve the problems caused by B1-field inhomogeneities have been proposed. It is evident that the nature of the inhomogeneities is affected by the polarization of the B1 field. As noted above, transmitter coil apparatuses have been proposed that have two supply ports, that is to say two transmission channels. If the associated transmitter coils are arranged perpendicular to each other, the result with a phase difference of 90° between the channels and the same amplitude is a circular polarization (CP) of the B1 field, which can represent an optimum with no examination subject. It has been found, however, that CP does not necessarily result in the best homogeneity of excitation, that is to say of the B1 field, when used with an examination subject. The scope afforded by the transmission channels also permits elliptical polarization. It has been shown, in an article by J. Nistler et al., "Homogeneity Improvement Using a 2 Port Birdcage Coil", Proc. ISMRM 15 (2007), Page 1063, how B1 homogeneity can be improved in the examination subject by means of excitation different to CP (corresponding to elliptical polarization (EP)). This involves varying the amplitudes of the supply voltages and the phase difference between the channels. It is also possible to offset field inhomogeneities as well as generating selectively positioned excitations when working with greater numbers of channels.

A first known approach to realizing an improvement is to select a polarization that has been shown to result in a relatively homogeneous B1 distribution on average across a majority of examination subjects (patients). There may for example be such a polarization, obtained from test measurements, available in each case for different applications/examination areas.

Another known approach provides for the use of what is referred to as patient-adaptive B1 shimming. This involves optimizing the amplitude characteristics and the phase difference of the transmission channel voltages for the examination subject to be scanned in each case. This realization requires that the B1 field distribution be measured prior to each examination (B1 mapping) in order that the optimal transmission parameters can be calculated. The measurement of the B1 field distribution and the calculation of the optimal excitation here require additional measurement time, which becomes even greater the more transmission channels there are. This application is more technically complex as well, because flexible actuation of the available transmission channels must be realized.

SUMMARY OF THE INVENTION

An object of the invention is to provide an acquisition technique that makes it possible to acquire high-quality magnetic resonance image data sets despite the presence of B1 inhomogeneities.

This object is achieved according to the invention by a method of the general type described above, but wherein raw data are acquired during at least two scanning operations with the magnetic resonance sequence, with different polarizations of the radio-frequency signals being used for at least two of the at least two scanning operations, following which the magnetic resonance image data set is determined by averaging of the raw data.

As explained, each polarization results in a certain distribution of the B1 field in the examination subject. Therefore if polarizations are used that result in a weaker and/or stronger B1 field in different parts of the scan area, at least one polarization that is used consequently exhibits greater homogeneity of excitation by the radio-frequency signal (that is to say a smaller variation between actual excitation and the target value) in at least one part of the scan area than at least one other polarization used and the resulting instances of signal attenuation become less noticeable in the resulting magnetic resonance image data set on averaging across the different scanning operations than if only a single polarization had been used for measurement. Ideally, the instances of signal attenuation occur in different areas for different polarizations so that signal attenuation due to individual polarizations can be reduced as compared with the capture of magnetic resonance image data using just a single polarization, as at least one other polarization used enables greater homogeneity of the B1 field in this part of the scan area.

Consequently, in accordance with the invention, the polarizations to be used are chosen such that, across the entire scan area, a level of homogeneity of the excitation produced by the radio-frequency signal exceeding at least one predefined homogeneity threshold exists for at least one polarization and in particular at least one other polarization used exceeds the homogeneity threshold for each part of the scan area for which a polarization falls short of the homogeneity threshold. The individual polarizations—and hence the raw data—thus complement each other optimally so that a higher-quality scan less affected by signal attenuation can be realized with simple means.

The method according to the invention can be used to particular advantage in applications in which multiple similar runs of the magnetic resonance sequence are conducted in any case and the raw data thus obtained is then averaged. Such a procedure is known in the prior art in cases in which, by way of example, the measured magnetic resonance signal is low anyway. Averaging over multiple scanning operations makes it possible to increase the signal-to-noise ratio. Diffusion measurements are one example of such applications in which raw data is anyway captured repeatedly with the magnetic resonance sequence. If, however, inhomogeneities of the B1 field result in signal attenuation or even a complete loss of signal intensity, the use of averaging can offer no solution in cases in which all data is captured using the same polarization.

In accordance with the invention, different polarizations can be used in the excitations for different runs (executions) of the magnetic resonance sequence. If, for example, a total of N scanning operations are performed, polarization A can be used for $N_1$ scanning operations and polarization B can be used for $N_2$ scanning operations, where $N_1+N_2=N$. It is of course entirely feasible to have more than two different polarizations here.

Not only does this lead to an improvement of the signal-to-noise ratio, but the expansion of the averaging process, provided for as standard, to multiple polarizations also shows significant improvements in the homogeneity of the resulting magnetic resonance image data set. The actual averaging process can be performed directly on the raw data or, if more expedient, on raw data that has already been at least partially evaluated. If the entirety of k-space is scanned with every polarization, it is of course also conceivable to determine images for each polarization, as evaluated raw data, and then to average these in order to obtain the improved magnetic resonance image data set.

The method according to the invention, however, can also be used in applications that do not ordinarily involve repeated runs of the magnetic resonance sequence and subsequent averaging, that is to say applications that ordinarily involve only one scanning operation. In this context, further scanning operations with the magnetic resonance sequence are added, at least some of which are performed with other polarizations. This makes it possible to average across the different raw data in this type of case as well.

Various embodiments are conceivable for determining suitable polarizations that can be used within the scope of the present invention. It is possible, for example, for the polarizations to be determined in the course of at least one calibration measurement. A first prerequisite for the use of the polarizations to capture raw data in the method according to the invention here is that they exhibit good B1 homogeneity per se in the scan area, it being the case, for example, that criteria known in principle, in particular threshold values and the like, can be used. Such polarizations described by corresponding parameter sets (amplitudes/amplitude characteristics and phase differences) nevertheless usually still exhibit areas in which signal attenuation can occur. Accordingly polarizations can further expediently be used within the scope of the present invention if they complement each other in relation to B1 homogeneity, as already explained. Such polarizations can be identified in calibration measurements.

It is especially expedient in this connection for multiple calibration measurements to be performed with different examination subjects and for the results of these measurements to be statistically evaluated to determine the polarizations. Performing calibration measurements on multiple examination subjects, in particular multiple patients, and statistically evaluating them makes it possible to identify polarizations that show at least comparable behavior with different patients, for example signal attenuation in similar areas, while other polarizations, for example, reliably show good homogeneity, for example variations with respect to the target value for the B1 field that do not exceed a homogeneity threshold, in precisely this part of the scan area even with different examination subjects. It has also been shown, however, that some polarizations can be strongly affected by patient properties or general properties of the examination subject.

It has proven beneficial in this context to perform calibration measurements for at least two groups of examination subjects and/or examination areas that differ in at least one property, with a polarization optimal in terms of homogeneity being determined for each group and the optimal polarizations of all groups being used as the polarizations for capturing raw data, or at least two polarizations to be used being determined for each group. It is thus conceivable, for example, for examination subjects to be divided into two groups that differ in at least one property. It is conceivable, for example, to apply a distinction between slimmer patients and more portly patients, for example using a limit value based on BMI or similar. Optimal polarizations, that is to say polarizations for optimal homogeneity of the B1 field, can be identified for both groups that, applied supplementarily with any examination subjects/patients, lead to improved and usable results on averaging across multiple scanning operations. Similar distinctions can also be drawn with regard to scan areas. If, for example, the scan area encompasses the abdomen with the liver, it is possible to identify polarizations that show the liver particular clearly but that exhibit signal attenuation in the area of the spinal column. Other polarizations can be identified that produce particularly homogeneous excitation of the spinal column but whose use in capturing magnetic resonance images results in a less clear depiction of the liver. Supplemented with the method according to the invention, however, magnetic resonance image data sets are delivered in which even the areas with an otherwise attenuated signal contain improved magnetic resonance image data because the polarizations used are complementary. It is also conceivable to perform the calibration measurements in such a way that two polarizations that complement each other optimally, or even a larger number of polarizations that complement each other optimally, are identified, in respect of which it should be noted that of course in the case of the use of groups as well more than two groups are used. If, for example, a polarization having outstanding B1 homogeneity properties for all but a certain part of the scan area is identified, a second polarization is sought that, statistically considered, shows good homogeneity in this area so that the complementary nature of the polarizations as described is realized.

An expedient embodiment of the invention provides for the use of at least two permanently specified polarizations, in particular a circular and an elliptical polarization, or for the polarizations to be selected as a function of the scan area and/or at least one property of the examination subject. The polarizations can of course be determined using the calibration measurements as described in this case. An advantage of this embodiment is that patient-specific B1 shimming, which requires additional measurement and computing time, is not absolutely essential. It is possible, for example, to use permanently predefined polarizations, for example a circular polarization and an elliptical polarization. It has been found that circular and elliptical polarizations complement each other in terms of their homogeneity as described for many scan areas. Such an embodiment can be used, for example, with magnetic resonance devices that do not offer the option to set the amplitudes and the phases of the individual transmission channels flexibly and instead offer only the ability to use two or more different, permanently specified polarizations. Such magnetic resonance devices are generally less technically complex than systems that permit free configuration of the transmission amplitudes and the transmission phases.

It is of course also possible in this context, for example as a result of the calibration measurements, to choose at least two polarizations specifically for particular scan areas and/or properties of the examination subject. If polarizations that complement each other outstandingly well for a scan area have been determined in the course of the calibration measurement for both thinner and more corpulent patients, for example, a set of polarizations based on the nature of the patient in this respect can be used for the capture of the magnetic resonance image data. It is of course also possible to group according to other patient properties.

An alternative embodiment for the performance of calibration measurements and/or the use of permanently specified polarizations or of polarizations selectable on the basis of the scan area and/or properties of the examination subject provides for the polarizations to be used in acquiring the raw data to be determined from a prior measurement performed for the examination subject to be scanned. In this case specific prior measurements are additionally used for an examination subject in order to facilitate a further improvement in the choice of polarizations. There are essentially two alternative embodiments here.

One approach provides, for example, for the prior measurement to be a measurement to determine the B1 field for at least one polarization, it being the case that polarizations that are optimal in relation to the homogeneity of the B1 field and/or complement each other optimally in relation to homogeneity are selected for the capture of the raw data. This embodiment consequently provides for the different polarizations to be used to be determined on a patient-specific basis in the course of B1 shimming. The aim of the calculation of the polarizations is then that the instances of signal attenuation possibly still remaining with the different polarizations be located in different parts of the scan area. It should be noted in this connection that there are cases in which it is not possible to determine a polarization that produces a homogeneous B1 distribution for an examination subject across the entire scan area. The present invention provides the possibility in such cases of determining and using at least two complementary polarizations so that, for example, after a measurement of the B1 field distribution, the calculation of polarization A can aim to realize the most homogeneous excitation possible in area X while polarization B permits the most homogeneous excitation possible in area Y.

In an alternative embodiment, in contrast, in the prior measurement to be used to acquire test data for different predefined polarizations, polarizations, which are optimal in relation to the homogeneity of the excitation produced by the radio-frequency signal and/or complement each other optimally in relation to the homogeneity of the excitation produced by the radio-frequency signal, are selected for the capture of the raw data. Methods that make use of predefined polarizations have also been proposed in the prior art, it being the case that the (a) polarization that showed the best image homogeneity in a preliminary measurement conducted in advance is used for the final measurement. The method according to the invention differs from this approach in that rather than it being necessary to determine a single "optimal" polarization from a population of predefined polarizations, the preliminary measurements can result in the population of specified polarizations being further limited, by suitable preliminary measurements, such that only a sub-population of the polarizations defined in the system are used for the subsequent measurements, that is to say the raw data acquisition operations.

As explained, the present invention can advantageously be applied to cases in which the intention was in any case to capture raw data with the magnetic resonance frequency in multiple scanning operations in order then to average this data. It is expedient in such cases to scan the entire k-space to be scanned in each scanning operation. Using multiple polarizations and scanning operations for measurements in which hitherto only a single scanning operation has been used, however, could lead to extended measurement times, which are undesirable.

In an embodiment of the present invention, for such cases consequently provides for at least some of the scanning operations to scan only a part of k-space to be scanned. It is consequently proposed to measure only a part of k-space in the different runs of the magnetic resonance sequence (or in at least some of these runs), that is to say, for example, to execute only some of the phase-encoding steps in each case. This makes it possible to limit the additional measurement time, potentially to the extent that it becomes negligible. Different specific embodiments of this idea are conceivable.

An approach can be taken, for example, in which the entirety of k-space to be scanned is scanned for the first scanning operation, while only a part of k-space to be scanned that includes the center of k-space is scanned for the at least one subsequent scanning operation. It is thus conceivable to measure the entirety of the totality of k-space to be scanned with one polarization in order then to scan additional, specifically selected parts of the totality of k-space to be scanned in the subsequent scanning operations with other polarizations in each case. The phase-encoding steps can be limited to parts of k-space to be scanned that encompass the center of k-space in these additional raw data capture procedures, for example. This procedure is advantageous because the signal intensity is determined largely by the center of k-space, while the other phase-encoding steps contain the contrast information.

An alternative embodiment to this provides for the scanning during each scanning operation of different parts of k-space to be scanned that do not correspond to the entirety of k-space to be scanned at an individual level but that do cover the entirety of k-space to be scanned taken together. It is possible in this case when using two polarizations, by way of example, to scan the first half of the totality of k-space to be scanned with polarization A and the other half with polarization B. It is also conceivable and preferred to scan somewhat more than half, for example ⅝, of k-space with each of the two polarizations, which extends the additional measurement time only slightly but makes it possible to scan parts around the center of k-space with both polarizations. This can of course be expanded to more than two polarizations. It is consequently particularly expedient in general for each part to encompass the center of k-space. Again the reason for this is that the center largely determines the signal intensity.

The invention relates not just to the method, but also to a magnetic resonance device containing a controller configured to implement the method according to the invention. All embodiments relating to the method according to the invention can be transferred analogously to the magnetic resonance device according to the invention, with which the advantages already indicated can consequently also be obtained. The magnetic resonance device here thus has a transmitter coil apparatus supplied via at least two transmission channels that make it possible to realize different polarizations, it being the case that the elements of the transmitter coil apparatus can also be supplied via a single actuation channel. The key factor is that different polarizations can be realized. The controller is configured to implement multiple scanning operations with the magnetic resonance sequence when capturing a magnetic resonance image data set but to actuate the transmitter coil apparatus with at least two different polarizations so that raw data from multiple scanning operations can be obtained and averaged.

BRIEF DESCRIPTION OF THE DRAWINGS

FIG. 1 is a flowchart of the method according to the invention.

FIG. 2 schematically illustrates the selection of polarizations that complement each other in relation to the homogeneity of the B1 field.

FIG. 3 shows a magnetic resonance apparatus according to the invention.

DESCRIPTION OF THE PREFERRED EMBODIMENTS

The method according to the invention for acquiring a magnetic resonance image data set makes it possible to acquire magnetic resonance images with improved homogeneity, which addresses the effects of B1 inhomogeneities. The is achieved by first selecting two different polarizations of the B1 field for excitation, which is possible because the magnetic resonance device has a transmitter coil apparatus with at least two transmission channels via which a polarization that is not circular polarization—elliptical polarization in the case of two transmission channels—can be configured. If the basic pulse shape for all transmission channels—and consequently all parts of the transmitter coil apparatus—is to be the same, even just a single actuation channel is sufficient. Polarizations are consequently characterized with a parameter set that contains amplitude characteristics and phase differences between the different transmission channels. It has been found that different polarizations produce different patterns of the B1 inhomogeneities that can cause the magnetic resonance signal to drop out or, at least, be attenuated. The method according to the invention, seeking to achieve images that are more homogeneous overall and show the entire scan area, consequently proposes to capture raw data in multiple scanning operations using at least two different polarizations when acquiring data with a particular magnetic resonance sequence in order to obtain the improved images by way of averaging. The exemplary embodiment presented here relates, by way of example, to the use of two polarizations, specifically polarization A and polarization B.

These polarizations are selected in a step S1. There are multiple different possibilities for this. It is conceivable, for example, for the two polarizations to be permanently specified, in particular also for the scan area and certain properties of the examination subject. Polarizations of this type that can be used immediately without need of preliminary measurements are ideally determined in calibration measurements not represented herein as a separate step, in particular by calibration measurements with multiple patients that can then be analyzed statistically. This approach makes it possible to determine polarizations suited to the method according to the invention for examination subjects having different properties and for different scan areas. This suitability depends in the present case on two characteristics. Firstly, each polarization should exhibit a level of homogeneity across the scan area that can fundamentally be described, on the basis of predefined criteria, as good, it still being entirely possible, however, for there to remain some parts of the scan area in which larger upward or downward variations of the B1 field, including attenuation or even dropout of the signal, may occur. This is because the second suitability criterion for polarizations that can be selected in step S1 is that different polarizations complement each other in respect of the parts in which signal attenuation can occur. If the one polarization has a part of the scan area in which significantly poorer homogeneity, that is to say a significant variation with respect to the target value for the B1 field, statistically occurs, the other polarization has good homogeneity in this area, that is to say a low variation with respect to the target value for the B1 field, and, where applicable, vice versa. Preferably two optimal polarizations having this complementary property can be identified. The fact that a statistical analysis encompassing multiple examination subjects is performed makes it extremely probable that the good homogeneity properties and the complementary property regarding the parts in which signal attenuation is a possibility will be achieved even with new examination subjects that have yet to be measured.

The pairs of polarizations thus obtained in calibration measurements (or also in larger numbers of polarizations in other exemplary embodiments) can be stored, for example, in a database sorted by scan areas and properties of examination subjects and selected in step S1 when the corresponding application is called at the magnetic resonance device.

Alternative exemplary embodiments of the present invention provide for the polarizations in step S1 to be determined using prior measurements performed for the examination subject to be scanned, it being the case that either a type of B1 shimming can be used for the B1 field distribution, following which polarizations that are optimal in relation to the homogeneity of the B1 field and complement each other optimally in relation to homogeneity can be calculated and selected for the capture of the raw data, although it is also possible for there to be different predefined polarizations available for which test data is acquired, it then being the case that optimal polarizations can be selected in accordance with the criteria already known, so that the group of predefined polarizations is reduced to the group of the most suitable polarizations.

All of the cases presented, however, share the same requirement that the polarizations complement each other with regard to attenuated parts of the scan area. This will be explained in more detail with reference to FIG. 2, which shows, as an example in schematic form, raw data for polarizations A and B in each case in scan area 1. This scan area here encompasses an organ 2, for example the liver, and the spinal column 3. It can be seen that attenuation occurs for polarization A in a part 4 in the region of the spinal column 3, but that the image homogeneity in the other parts of the scan area 1 is very good as a result of the good homogeneity of excitation. Attenuation of the signal also occurs for polarization B (sub-image at top right), this time in a part 5 in the region of the organ 2; the remaining parts of the scan area 1 are reproduced in good quality, as homogeneity of excitation, and consequently of the B1 field, is achieved here.

Combining the raw data captured with polarization A and the raw data acquired with polarization B, as indicated by the arrows 6, by averaging produces a complete image P of the scan area 1, with the instances of attenuation significantly reduced. This is because polarization B shows good homogeneity of excitation for part 4, while polarization A likewise shows good homogeneity for part 5 of the scan area 1 such that when combined, the raw data in both parts 4, 5 contributes to the magnetic resonance signal.

Implementing this underlying idea in the method, cf. once again FIG. 1, requires the capture of raw data using the different polarizations A and B in a step S2 in multiple successive scan operations with the magnetic resonance sequence. There is again a general distinction to be made herein between different cases.

If a magnetic resonance data set is to be captured for which it was in any case intended to capture raw data in multiple scan operations with the magnetic resonance sequence and to average this data, one of the polarizations A or B is used for just one part of the scan operations in each case. Specifically, excitation is accordingly modified in the magnetic resonance sequence such that polarization A or polarization B is produced. It can in principle be expedient in this connection to capture equal quantities of raw data with polarization A and polarization B, it of course being the case that weightings are also possible after thorough analysis of polarizations A and B. If, for example, polarization A shows better homogeneity overall and significantly smaller variations than polarization B, it is also perfectly possible to perform more scan operations with polarization A than with polarization B and so forth.

Where an application usually involves only a single scan operation, however, additional scan operations, in the present case thus at least one additional scan operation, with the other polarization are added in step S2. Only a part of the totality of k-space to be scanned is scanned with each of polarizations A and B here, by reducing and adapting the phase-encoding steps accordingly, in order to keep the increase in the measurement time small. In this case, the first ⅝, including the center of k-space, are scanned with polarization A and the last ⅝, including the center of k-space, are scanned with polarization B. The center of k-space, which is extremely important for the signal intensity, is thus scanned in both scan operations and consequently with both polarizations, whereas peripheral areas of k-space are sampled with only one polarization, but this is less important and the measurement time is increased only slightly. It is of course also conceivable, although less preferable, to divide k-space completely into two halves. Another variant of the invention provides for the entirety of k-space to be recorded with one polarization, for example polarization A, with only a part of k-space then being recorded with polarization B. Once again the latter preferably includes the center of k-space. It can be seen that there are various possibilities for keeping the measurement time small while still obtaining additional raw data in parts 4,5 of the scan area 1 otherwise affected by attenuation.

The raw data is subsequently combined in a step S3 by means of averaging, cf. also the arrows 6 in FIG. 2, to create the magnetic resonance data set. It is also possible in principle to reconstruct a finished image from each data set measured with a polarization and average these images, which can themselves then also be regarded as raw data (albeit evaluated raw data). However this does necessitate measuring the entire k-space with each polarization.

It has been found in examinations performed by the inventors that in EPI diffusion measurements with STIR fat suppression in which a bipolar diffusion scheme was used, for example, the use of two polarizations, one circular and one elliptical, was sufficient on its own to produce a significant improvement in the quality of the magnetic resonance image data set owing to the fact that the different polarizations showed pronounced signal attenuation or signal dropout in different regions and thus multiple measurement with these polarizations and subsequent averaging led to both an improvement in the signal-to-noise ratio and an improvement in the homogeneity of the resulting image.

FIG. 3 shows a schematic diagram of a magnetic resonance apparatus 7 according to the invention. The basic known components encompasses a main magnet unit 8 containing the main magnet that generates the static magnetic field, in the present case a static magnetic field ≥3 T. The main magnet unit 8 defines a patient aperture 9 provided around which, as known in principle, are a gradient coil apparatus 10 and a transmitter coil apparatus 11.

The operation of the magnetic resonance device 7 is controlled by a controller 12 configured to implement the method according to the invention and thus to actuate the magnetic resonance device 7 to capture raw data using different polarizations with a magnetic resonance sequence and to average this raw data. Different polarizations can be realized because the transmitter coil apparatus 11 can be actuated via two transmission channels 13, indicated only schematically, so that it is possible to realize not only circular polarizations, for example, but also different elliptical polarizations. The present invention of course also can be used with transmitter coil apparatuses having a greater number of transmission channels.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for acquiring a magnetic resonance (MR) image data set, comprising:
    operating an MR scanner comprising a transmitter coil, while an examination subject is situated in said MR scanner, to emit a radio-frequency signal from said transmitter coil that emits a radio-frequency signal with multiple, different polarizations of said radio-frequency signal in a volume of the examination subject;
    operating the MR scanner according to a magnetic resonance sequence comprising at least two scan operations in which said different polarizations of said radio-frequency signals are respectively produced, and acquiring a respective set of raw MR data in the respective two scan operations; and
    providing the respective sets of raw data to a computer and, in said computer, producing a magnetic resonance image data set by averaging the sets of raw data, and making said magnetic resonance image data set available in electronic form as a data file.

2. A method as claimed in claim 1 wherein said transmitter coil comprises two transmission channels, and emitting said radio-frequency signals having said multiple different polarizations respectively via said at least two transmission channels.

3. A method as claimed in claim 1 comprising emitting said radio-frequency signals with a first of said multiple polarizations that generates a greater homogeneity of excitation by said radio-frequency signal in at least one portion of said volume than a second of said multiple polarizations.

4. A method as claimed in claim 1 comprising emitting said radio-frequency signals with said multiple different polarizations configured to produce, across an entirety of said volume, a level of homogeneity of excitation that exceeds a predetermined homogeneity threshold.

5. A method as claimed in claim 4 comprising emitting said radio-frequency signals with said multiple different polarizations to produce said level of homogeneity of said excitation that exceeds said predetermined homogeneity threshold by causing a polarization, among said multiple different polarizations, to exceed said homogeneity threshold in each portion of said volume wherein the polarization does not reach said homogeneity threshold.

6. A method as claimed in claim 1 comprising determining said multiple different polarizations by operating said MR scanner in at least one calibration measurement.

7. A method as claimed in claim 6 comprising operating said MR scanner in multiple calibration measurements with different examination subjects, and statistically evaluating said multiple calibration measurements to determine the multiple different polarizations for said examination subject.

8. A method as claimed in claim 7 comprising performing said calibration measurements for at least two groups of examination subjects or two groups of scan areas that respectively differ with regard to at least one property, and, for each group, determining a polarization that is optimal for producing homogeneity, and using the optimal polarizations respectively from all groups as the multiple different polarizations for acquiring said MR raw data from said examination subject, or using at least two polarizations from each group.

9. A method as claimed in claim 1 comprising emitting said radio-frequency signals with at least two permanently specified different polarizations.

10. A method as claimed in claim 9 wherein said two permanently specified polarizations are a circular polarization and an elliptical polarization.

11. A method as claimed in claim 1 comprising selecting said multiple different polarizations as a function of at least one of said volume and a property of said examination subject.

12. A method as claimed in claim 1 comprising determining said multiple different polarizations from a previous data acquisition of said volume of said examination subject obtained prior to acquiring said MR data from said volume.

13. A method as claimed in claim 12 comprising operating said MR scanner in said prior measurement to determine the B1 field for at least one of polarization, and using, as said multiple different polarizations, polarizations that are optimal with regard to homogeneity of said B1 field or polarizations that complement each other to produce a homogeneity, for acquiring said MR raw data.

14. A method as claimed in claim 12 comprising, in said previous measurement, acquiring test data for different predetermined polarizations, and determining, as said multiple different polarizations for acquiring said MR raw data, polarizations that are optimal relative to a homogeneity of an excitation produced by said radio-frequency signal or that complement each other in relation to said homogeneity.

15. A method as claimed in claim 1 comprising providing a memory organized as k-space into which said MR raw data are entered, and filling an entirety of k-space with MR raw data in each of said scan operations.

16. A method as claimed in claim 1 comprising providing a memory organized as k-space into which said MR raw data are entered, and, in at least some of said scan operations, filling only a portion of k-space with said MR raw data.

17. A method as claimed in claim 1 comprising providing a memory organized as k-space into which said MR data are entered, and filling an entirety of k-space with MR raw data from a first of said scan operations, and filling only a portion of k-space, which includes a center of k-space, with raw data acquired in a subsequent scan operation following said first of said scan operations.

18. A method as claimed in claim 17 comprising, in each scan operation, filling different parts of k-space with MR data, said parts not corresponding to an entirety of k-space, and filling said different parts to a level that does not fill an entirety of k-space, when said parts are combined.

19. A method as claimed in claim 18 wherein each of said parts comprises a center of k-space.

20. A magnetic resonance apparatus comprising:

an MR scanner comprising a radio-frequency (RF) transmitter coil;

a control computer configured to operate the MR scanner, while an examination subject is situated in said MR scanner, to emit a radio-frequency signal from said RF transmitter coil with multiple, different polarizations of said radio-frequency signal in a volume of the examination subject;

said control computer configured to operate the MR scanner according to a magnetic resonance sequence comprising at least two scan operations in which said different polarizations of said radio-frequency signals are respectively produced, and to acquire a respective set of raw MR data in the respective two scan operations; and an image reconstruction computer provided with the respective sets of raw data, said image reconstruction computer, being configured to produce a magnetic resonance image data set by averaging the sets of raw data, and to make said magnetic resonance image data set available in electronic form as a data file.

* * * * *